United States Patent [19]
Cao et al.

[11] Patent Number: 6,081,130
[45] Date of Patent: Jun. 27, 2000

[54] CLOCK CONTROLLED EXCLUSIVE OR CIRCUIT

[75] Inventors: Tai A. Cao; Hieu Trong Ngo; Khanh Tuan Vu Nguyen, all of Austin, Tex.

[73] Assignee: International Business Machines Corporation, Armonk, N.Y.

[21] Appl. No.: 09/100,352

[22] Filed: Jun. 19, 1998

[51] Int. Cl.$^7$ .................................................. H03K 19/21
[52] U.S. Cl. .................. 326/55; 326/95; 326/98
[58] Field of Search ................. 326/52–55, 93, 326/95, 98, 112, 119, 121, 113

[56] References Cited

U.S. PATENT DOCUMENTS

| | | | |
|---|---|---|---|
| 4,233,524 | 11/1980 | Burdick | 326/55 |
| 4,710,650 | 12/1987 | Shoji | 326/93 |
| 5,117,133 | 5/1992 | Luebs | 326/95 |
| 5,508,640 | 4/1996 | Partovi et al. | 326/98 |
| 5,508,641 | 4/1996 | Appenzeller et al. | 326/113 |
| 5,777,491 | 7/1998 | Hwang et al. | 326/113 |
| 5,942,916 | 8/1999 | Matsbara et al. | 326/93 |

*Primary Examiner*—Jon Santamauro
*Assistant Examiner*—Don Phu Le
*Attorney, Agent, or Firm*—Russell D. Culbertson; Shaffer & Culbertson, LLP; Anthony V.S. England

[57] ABSTRACT

An exclusive OR circuit (10) includes an input stage (11) and a control arrangement (12,13) for controlling an exclusive OR logical evaluation. The control arrangement includes a pre-charge stage (12) which responds to a first level clock signal to enable the desired exclusive OR logical evaluation. The input stage (11) is connected to receive a first input signal and a second input signal and is also connected to an evaluation node (23). When the logic state of one input signal is unequal to the logic state of the other input signal, the input stage (11) couples the evaluation node (23) to ground. An output stage (13) of the control arrangement inverts the signal at an internal node (24) to produce the output from the exclusive OR circuit. A pre-charge stage (12) couples the internal node (24) to the evaluation node (23) only in response to a "high" clock signal. Coupling the internal node (24) and evaluation node (23) allows the internal node to follow the state of the evaluation node and produce the desired exclusive OR evaluation through the output stage (13).

13 Claims, 4 Drawing Sheets

CLOCK CONTROLLED EXCLUSIVE OR CIRCUIT

TECHNICAL FIELD OF THE INVENTION

This invention relates to digital logic circuits, and particularly to exclusive OR circuits. The invention also encompasses a method for providing an exclusive OR logic function.

BACKGROUND OF THE INVENTION

Microprocessor designs use many different types of logic circuits which provide a desired logic level output signal in response to one or more logic level input signals. Each logic circuit input signal comprises a signal at one of two alternate voltage levels, each alternate level corresponding to a logic state. A "low" level voltage signal represents one logic state while a "high" level voltage signal represents the alternate logic state. The voltage range for a valid "low" signal as well as the range for a valid "high" signal are determined by the types of semiconductor devices used to build the particular logic circuit.

An exclusive OR circuit (commonly referred to as an "XOR" circuit) is a common logic building block used repeatedly in microprocessors. The output of an exclusive OR circuit comprises a logical "high" output only when the logic state of a first input signal is unequal to the logic state of a second input signal. Thus, an exclusive OR circuit produces a "high" output only when the first input to the circuit is at a logic state which is opposite to the logic state of the second input. When the first input signal and the second input signal to the exclusive OR circuit are equal, either both "low" or both "high", the circuit produces a "low" level output signal.

As with all logic circuits used in a microprocessor, the performance of the exclusive OR circuit is critical to the cycle time of the microprocessor. The physical size of the exclusive OR circuit is also important because it is used so frequently in microprocessors. Also it is important that the exclusive OR circuit dissipate a minimum amount of power in providing the desired logic function.

An exclusive OR circuit and other logic circuits may be connected together in a cascade arrangement such that the output of one circuit provides the input to another circuit. It is important in this cascade circuit arrangement that the logic circuits be synchronized so that each circuit provides the desired logic output in a timely fashion for use by the next logic circuit in the series. Each circuit must produce and maintain the desired logic level output so that following logic circuits may perform the intended logic function.

SUMMARY OF THE INVENTION

It is an object of the invention to provide an exclusive OR circuit which provides a valid logic output only in response to a clock signal. It is also an object of the invention to provide a method for producing an exclusive OR logic function in response to a clock signal.

These objects are accomplished in an exclusive OR circuit with a pass gate input arrangement combined with a clock control arrangement. The pass gate arrangement receives a first input signal and a second input signal. The clock control enables an exclusive OR output from the circuit only when a first clock signal level is applied to the clock control arrangement. Thus the clock signal controls when the circuit produces the desired logical output. The exclusive OR circuit according to the invention may be connected in series with other logic circuits which may or may not be clock controlled.

The exclusive OR circuit according to the invention includes an input stage, an output stage, and a pre-charge stage. The input stage comprises the pass gate arrangement and includes a first input transistor connected to receive a first input signal and a second input transistor connected to receive a second input signal. Both the first and second input transistors are connected to an evaluation node. The first and second input transistors function to couple the evaluation node to ground when the first and second input signals are unequal, that is, when the logic state of one input signal is opposite to the logic state of the other input signal.

The pre-charge stage includes a pre-charge transistor and an evaluation transistor, both connected to a clock input and controlled by the state of the clock signal appearing on the clock input. The pre-charge transistor couples an internal node to a supply voltage in response to a second clock signal level and isolates the internal node from the supply voltage in response to a first clock signal level. The evaluation transistor couples the internal node to the evaluation node in response to the first clock signal level, and isolates the evaluation node from the internal node in response to the second clock signal level.

The output stage includes an inverter and preferably a keeper transistor. The inverter inverts the signal at the internal node and applies the inverted signal at an output node which carries the circuit output. The keeper transistor is controlled by the signal at the output node and functions to couple the internal node to the supply voltage when the signal at the output node is at a "low" level.

The exclusive OR circuit according to the invention provides clock controlled dynamic logic. The clocked operation of the circuit enables synchronization with adjacent logic circuits and prevents signal degradation. The present exclusive OR circuit also provides high-performance with low energy dissipation and is optimized for fabrication using silicon-on-insulator technology.

These and other objects, advantages, and features of the invention will be apparent from the following description of the preferred embodiments, considered along with the accompanying drawings.

DESCRIPTION OF THE PREFERRED EMBODIMENTS

Figure 1:
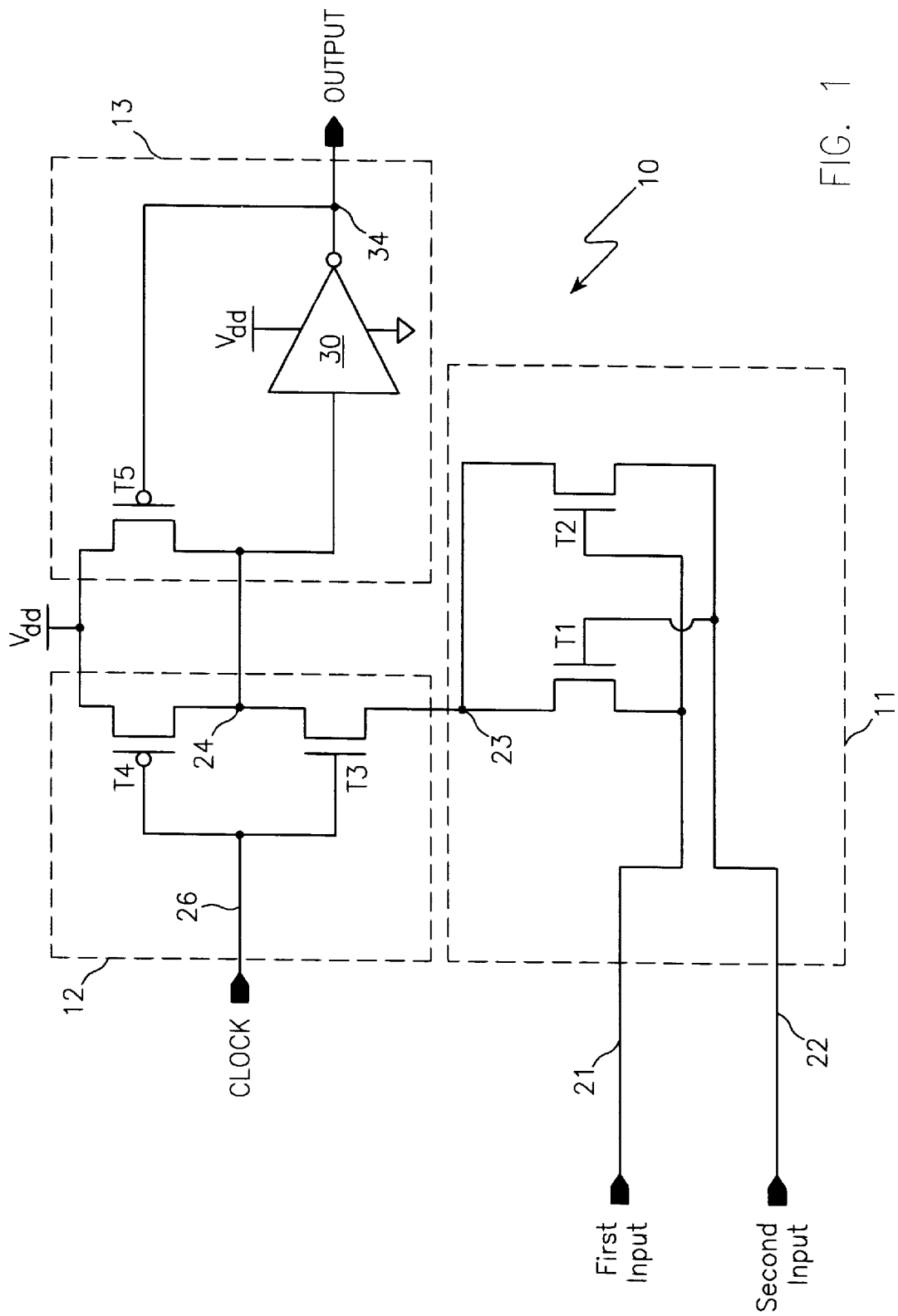
FIG. 1 is an electrical schematic diagram illustrating an exclusive OR circuit embodying the principles of the invention.

Referring to FIG. 1, an exclusive OR circuit 10 embodying the principles of invention includes an input stage 11, a pre-charge stage 12, and an output stage 13. The input stage 11 includes a first input transistor T1 and a second input transistor T2. First input transistor T1 comprises an N-type device and has a source-drain conduction path connecting a first input 21 and an evaluation node 23. The gate of first input transistor T1 is connected to a second input 22. Second input transistor T2 comprises an N-type device having a source-drain conduction path connecting the second input 22 to the evaluation node 23. The gate of second input transistor T2 is connected to the first input 21. First input 21 receives a first input signal to the exclusive OR circuit 10 while second input 22 receives a second input signal to the exclusive OR circuit.

The pre-charge stage 12 of exclusive OR circuit 10 comprises an evaluation transistor T3 and a pre-charge transistor T4. Evaluation transistor T3 comprises an N-type device having a source-drain conduction path connecting an internal node 24 and the evaluation node 23. The gate of evaluation transistor T3 is connected to a clock input 26. Pre-charge transistor T4 comprises a P-type device having a drain-source conduction path connecting a supply voltage $V_{dd}$ to internal node 24. The gate of pre-charge transistor T4 is also connected to clock input 26. Clock input 26 is connected to receive a clock signal comprising alternatively a first clock signal level and a second clock signal level. The first clock signal level in the illustrated form of the invention comprises a "high" level signal which may, for example, be approximately 2.25 volts, while the second clock signal level comprises a "low" level voltage signal near ground.

The output stage 13 includes an inverter circuit 30 and a keeper transistor T5. Inverter circuit 30 preferably comprises a CMOS inverter operating at the supply voltage level $V_{dd}$. The input to inverter circuit 30 is connected to the internal node 24 while the output of the inverter circuit is connected to an output node 34. Thus, inverter circuit 30 inverts the signal at internal node 24 and applies the inverted signal at output node 34. Output node 34 carries the output from the exclusive OR circuit 10.

Keeper transistor T5 comprises a P-type device having a drain-source conduction path connecting the supply voltage $V_{dd}$ to internal node 24. The gate of keeper transistor T5 is connected to output node 34. Keeper transistor T5 is relatively small compared to the evaluation transistor T3 and first and second input transistors, Ti and T2 respectively.

The input stage transistors T1 and T2 operate to couple evaluation node 23 to ground when the first input signal is not equal to the second input signal. For example, when the first input signal comprises a "high" level signal and the second input signal comprises a "low" level signal, second input transistor T2 is biased to conduct. The "low" second input signal is coupled to ground and thus when second input transistor T2 is biased to conduct it functions to couple the evaluation node 23 to ground. Alternatively, when the second input signal comprises a "high" level signal and the first input signal comprises a "low" level signal, first input transistor T1 is biased to conduct, thereby coupling evaluation node 23 to ground through first input line 21. However, when the first input signal is equal to the second input signal, either both "high" or both "low", neither input transistor T1 or T2 is biased to conduct. Consequently, when the input signals at inputs 21 and 22 are equal, input transistors T1 and T2 isolate evaluation node 23 from ground.

The pre-charge and output stages, 12 and 13, respectively, function as a control for the output of the exclusive OR circuit 10. When the "low" second clock signal level appears at clock input 26, the signal biases evaluation transistor T3 to a nonconductive state and biases pre-charge transistor T4 to a conductive state. In this "low" clock signal condition, evaluation transistor T3 isolates internal node 24 from the evaluation node 23. At the same time pre-charge transistor T4 conducts to couple internal node 24 to the supply voltage $V_{dd}$ and thereby pre-charge the internal node to the supply voltage level. The internal node charge to the supply voltage level $V_{dd}$ is inverted by inverter circuit 30 to produce a "low" signal at output node 34. Thus, when the "low" second clock signal level is applied at clock input 26, the output node 34 is maintained at the "low" state regardless of the signals appearing at the first input 21 and second input 22. This "low" signal at output node 34 also biases keeper transistor T5 to conduct.

When the "high" first clock signal level is applied to clock input 26, pre-charge transistor T4 is biased to a non-conductive state while evaluation transistor T3 is biased to a conductive state. Under this condition, evaluation transistor T3 couples internal node 24 to evaluation node 23 enabling the internal node charge state to follow the charge state of the evaluation node. If the input signals on first and second inputs 21 and 22 are equal at a steady state when the first clock signal level is applied to clock input 26, evaluation node 23 remains isolated by input transistors T1 and T2, and the internal node is maintained at a "high" charge state. This "high" signal at internal node 24 is inverted by inverter 30 to produce a "low" or second level output. In this condition in which the clock control enables the exclusive OR logic function but the function produces a "low" output at output node 34, keeper transistor T5 is biased to a conductive state to maintain the "high" charge state at internal node 24.

However, if the first and second input signals are unequal at a steady state when the "high" first clock signal level is applied to clock input 26, either first input transistor T1 or second input transistor T2 couples evaluation node 23 to ground and internal node 24 may discharge quickly through evaluation transistor T3 to a "low" signal level. This "low" internal node charge level is inverted by inverter 30 to produce a "high" signal level or first logical output signal at output node 34. It will be noted that the relatively smaller size of keeper transistor T5 allows internal node 24 to discharge below the switching level of inverter 30 even though transistor T5 is initially in a conductive state. Once the "high" signal level develops at output node 34, the signal biases keeper transistor T5 to a nonconductive state to prevent the keeper transistor from fighting against the discharge of internal node 24.

Figure 2:
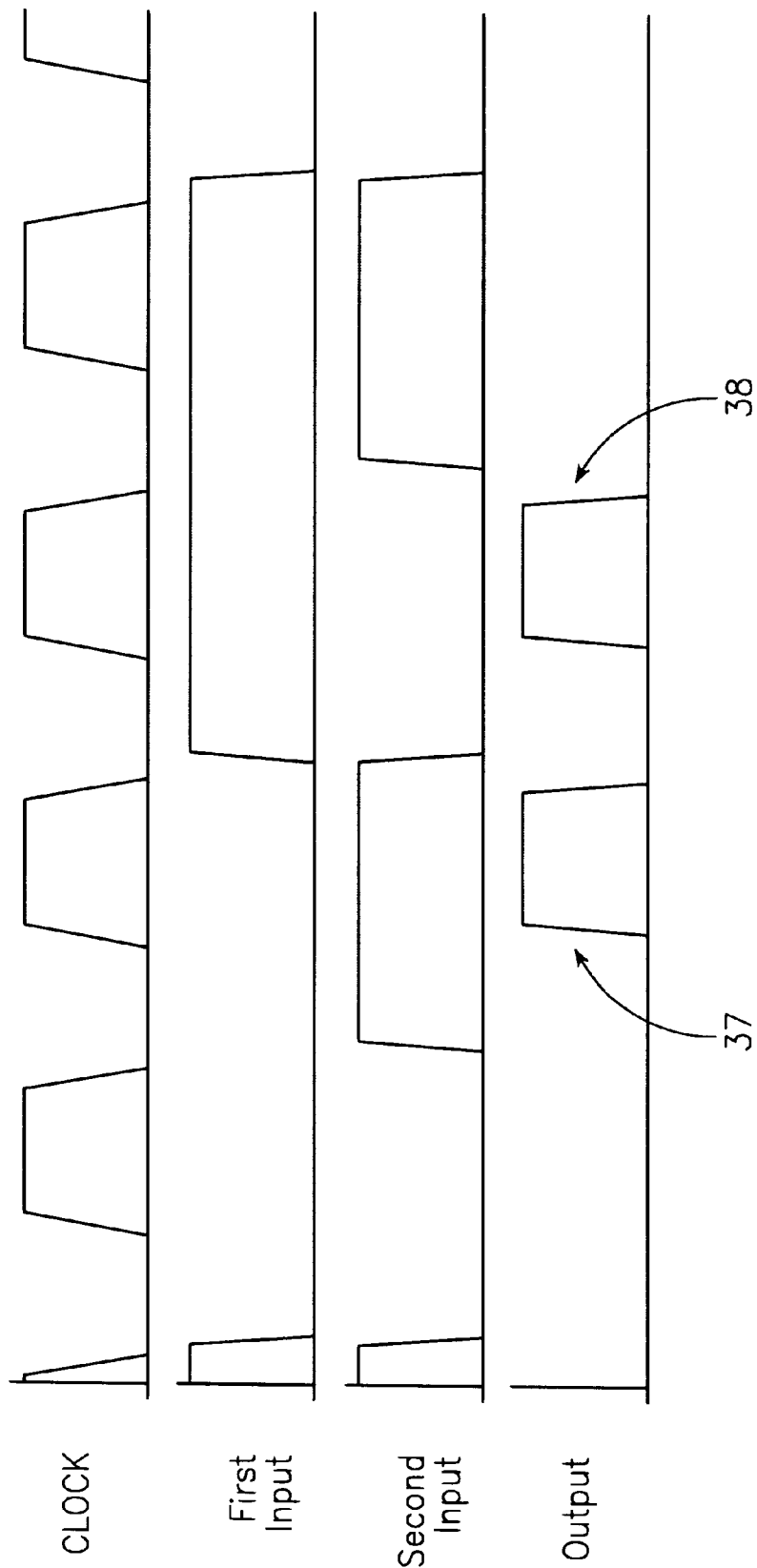
FIG. 2 is a signal timing chart illustrating the operation of the circuit shown in FIG. 1.

The timing chart shown in FIG. 2 illustrates the operation of the exclusive OR circuit 10 shown in FIG. 1. The "high" clock signal level is preferably at the supply voltage level $V_{dd}$ as is the "high" signal input level. As shown in the timing chart, the exclusive OR circuit 10 according to the invention produces a logical exclusive OR evaluation only when enabled by a "high" clock signal level. As shown at 37 and 38 in the timing chart, the exclusive OR circuit 10 produces a "high" output only when the input signal states are unequal and the "high" or first clock signal level is applied to the clock input (26 in FIG. 1). When the clock signal comprises a "low" level or second clock signal level, output node 34 (FIG. 1) is maintained at a "low" level regardless of the state of the input signals (inputs 21 and 22 in FIG. 1). It will be noted that the input signals need not be of equal duration. The first input signal illustrated in FIG. 2 has a much longer duration than the second input signal.

Figure 3:
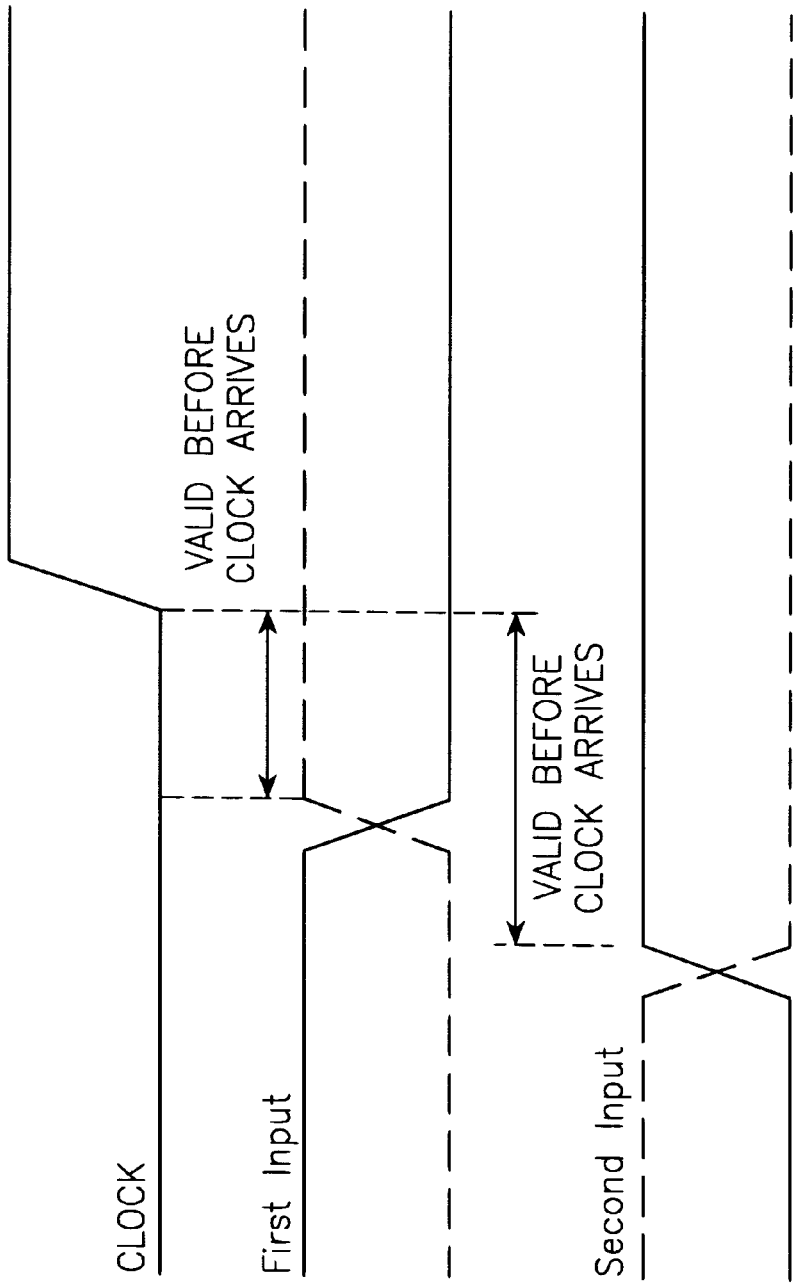
FIG. 3 is a signal timing chart showing a preferred timing between the clock signal and input signals.
Figure 4:
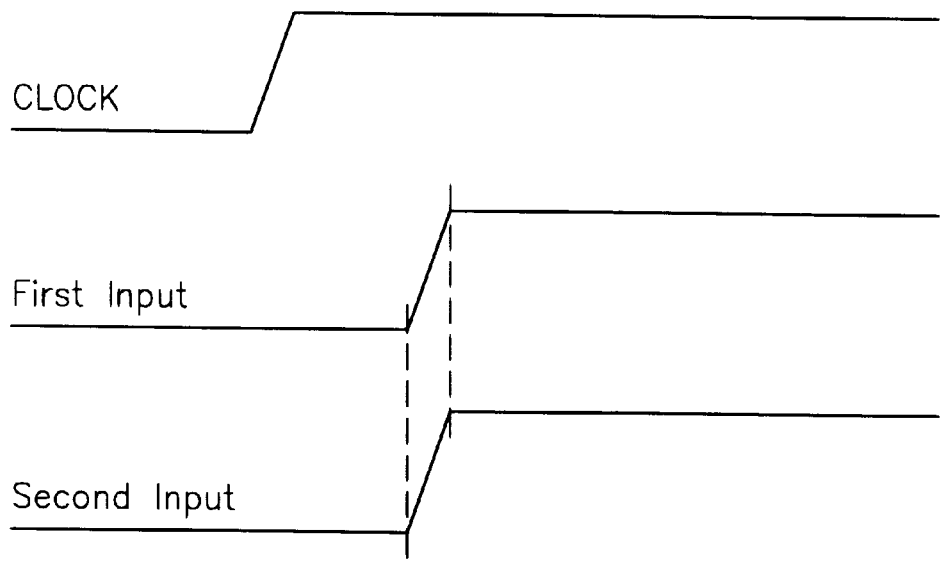
FIG. 4 is a signal timing chart showing another possible timing arrangement between the clock signal and input signals.
Figure 5:
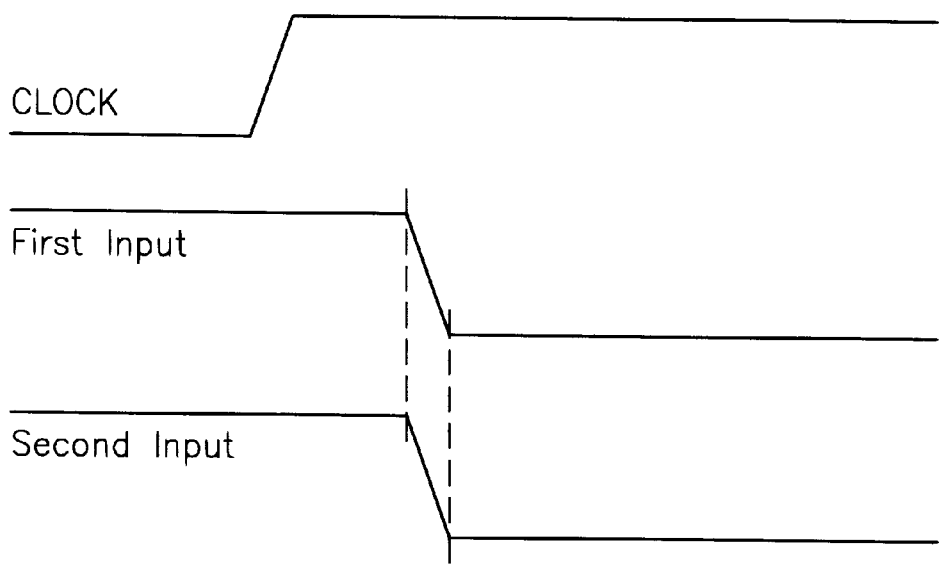
FIG. 5 is a signal timing chart showing another possible timing arrangement between the clock signal and input signals.

The exclusive OR circuit 10 requires certain timing between the clock signals at clock input 26 and input signals at input lines 21 and 22. FIGS. 3 through 5 illustrate this required signal timing. Referring to FIG. 3, exclusive OR circuit 10 performs a valid exclusive OR operation when the input signals both reach a steady state before the first clock signal level is applied at clock signal input 26. This signal timing is the preferred timing for the circuit 10. As shown in FIGS. 4 and 5, exclusive OR circuit 10 also performs a valid exclusive OR operation when the first clock signal level arrives first, and the input signals arrive later but at substantially the same time. In order to help ensure that the two input signals arrive at the same time at exclusive OR circuit 10, the input signals should originate from a circuit immediately adjacent to the exclusive OR circuit 10. In laying out the exclusive OR circuit 10, special care should be taken to ensure that the two input lines 21 and 22 are substantially equal in length. Furthermore, across chip line variation (ACLV), supply voltage variation, and temperature variation must be simulated to make sure that an interim period of overlap between opposite logical signals at the circuit inputs 21 and 22 is short enough in duration that the overlap condition cannot change the output from the exclusive OR circuit 10 to a "high" logical output.

The above described preferred embodiments are intended to illustrate the principles of the invention, but not to limit the scope of the invention. Various other embodiments and modifications to these preferred embodiments may be made by those skilled in the art without departing from the scope of the following claims. For example, the exclusive OR circuit according to invention is not limited to a particular supply voltage level, input signal level, or clock signal level. Furthermore, the invention is not limited by any particular range of "high" and "low" signal levels. The "high" and "low" signal ranges will be dependent upon the particular technology utilized to implement the devices T1, T2, T3, T4, and T5 and the inverter 30. Also, although the invention is illustrated with MOSFET devices, other transistor devices may be utilized to implement an exclusive OR circuit within the scope of the invention.

We claim:

1. An exclusive OR circuit comprising:
   (a) an input stage connected to an evaluation node and enabling the evaluation node to discharge in response to a first input signal and a second input signal which is unequal to the first input signal;
   (b) a pre-charge stage responsive to a second clock signal level to pre-charge an internal node and responsive to a first clock signal level to couple the internal node to the evaluation node; and
   (c) an output stage connected to the internal node and to an output node, the output stage for inverting a signal at the internal node and applying said inverted signal to the output node.

2. The exclusive OR circuit of claim 1 wherein the output stage includes:
   (a) an inverter circuit; and
   (b) a keeper transistor having a drain-source conduction path connected between a supply voltage source and the internal node, and having a gate connected to the output node.

3. The exclusive OR circuit of claim 1 wherein the input stage includes:
   (a) a first input transistor having a source-drain conduction path connected between the evaluation node and a first input for receiving the first input signal, the first input transistor further having a gate connected to receive the second input signal; and
   (b) a second input transistor having a source-drain conduction path connected between the evaluation node and a second input for receiving the second input signal, the second input transistor further having a gate connected to receive the first input signal.

4. The exclusive OR circuit of claim 1 wherein the pre-charge stage includes:
   (a) a pre-charge transistor having a drain-source conduction path connected between a supply voltage source and the internal node and having a gate connected to a clock input on which clock signals at the first and second clock signal level are applied; and
   (b) an evaluation transistor having a source-drain conduction path connected between the internal node and the evaluation node and having a gate connected to the clock input.

5. The exclusive OR circuit of claim 1 wherein:
   (a) the input stage includes a first input transistor and a second input transistor, the first input transistor having a source-drain conduction path connected between the evaluation node and a first input for receiving the first input signal, and having a gate connected to receive the second input signal, the second input transistor having a sourcedrain conduction path connected between the evaluation node and a second input for receiving the second input signal, and having a gate connected to receive the first input signal; and
   (b) the pre-charge stage includes a pre-charge transistor and an evaluation transistor, the pre-charge transistor having a drain-source conduction path connected between a supply voltage source and the internal node and having a gate connected to a clock input, the evaluation transistor having a source-drain conduction path connected between the internal node and the evaluation node and having a gate connected to the clock input.

6. The exclusive OR circuit of claim 5 wherein the output stage includes:
   (a) an inverter circuit; and
   (b) a keeper transistor having a drain-source conduction path connected between the supply voltage source and the internal node, and having a gate connected to the output node.

7. In an exclusive OR circuit having an input stage with a first input and a second input, and providing a first logical output signal in response to a first clock signal level and unequal first and second input signals at the input stage, the improvement comprising:
   (a) a pre-charge stage portion of a clock control arrangement, the pre-charge stage having a pre-charge transistor and an evaluation transistor, the pre-charge transistor having a drain-source conduction path connected between a supply voltage source and an internal node and having a gate connected to a clock input, the evaluation transistor having a source-drain conduction path connected between the internal node and an evaluation node and having a gate connected to the clock input; and
   (b) an output stage portion of the clock control arrangement, the output stage having an inverter circuit and a keeper transistor, the inverter for inverting a signal at the internal node and applying the inverted signal to an output node, the keeper transistor having a drain-source conduction path connected between the supply voltage source and the internal node, and having a gate connected to the output node.

8. A method of providing an exclusive OR logic function, the method comprising the steps of:
   (a) enabling an evaluation node to discharge in response to a first input signal and a second input signal which is unequal to the first input signal;

(b) pre-charging an internal node in response to a second clock signal level;

(c) coupling the internal node to the evaluation node in response to a first clock signal level; and (d) inverting the signal at the internal node to produce an output signal.

9. The method of claim 8 wherein the step of pre-charging the internal node comprises the step of:

(a) applying the second clock signal level to a gate of a pre-charge transistor having a drain-source conduction path connecting the internal node to a supply voltage source.

10. The method of claim 8 further comprising the step of:

(a) applying a supply voltage to the internal node when the output signal comprises a second signal level.

11. The method of claim 8 wherein the step of enabling the evaluation node to discharge comprises the step of:

(a) applying the first input signal to the source electrode of a first input transistor and the second input signal to the gate of the first input transistor, the drain of the first input transistor being connected to the evaluation node.

12. The method of claim 8 wherein the step of enabling the evaluation node to discharge comprises the step of:

(a) applying the second input signal to the source electrode of a second input transistor and the first input signal to a gate of the second input transistor, the drain of the second input transistor being connected to the evaluation node.

13. The method of claim 8 wherein the step of coupling the internal node to the evaluation node comprises the step of:

(a) applying the first clock signal level to a gate of an evaluation transistor having a source-drain conduction path connecting the internal node to the evaluation node.

* * * * *